US006801470B2

(12) United States Patent
Clark et al.

(10) Patent No.: US 6,801,470 B2
(45) Date of Patent: Oct. 5, 2004

(54) DIGITAL REGULATION CIRCUIT

(75) Inventors: Lawrence T. Clark, Phoenix, AZ (US); Neil F. Duetscher, Tempe, AZ (US)

(73) Assignee: Intel Corporation, Santa Clara, CA (US)

( * ) Notice: Subject to any disclaimer, the term of this patent is extended or adjusted under 35 U.S.C. 154(b) by 25 days.

(21) Appl. No.: 10/329,125

(22) Filed: Dec. 23, 2002

(65) Prior Publication Data

US 2004/0119453 A1 Jun. 24, 2004

(51) Int. Cl.[7] .................................................. G11C 7/00
(52) U.S. Cl. ...................................................... 365/226
(58) Field of Search ....................... 365/189.09, 185.18, 365/185.2, 185.24, 185.27, 201, 202, 226–229, 230.03, 230.09; 327/534, 535, 538; 323/312, 313

(56) References Cited

U.S. PATENT DOCUMENTS 5,367,655 A * 11/1994 Grossman et al. ..... 365/230.03
6,515,921 B2 * 2/2003 Koshikawa ................. 365/200
6,560,729 B1 * 5/2003 Anuntapong et al. ....... 714/718
6,717,850 B1 * 4/2004 Li et al. ................ 365/185.09

* cited by examiner

*Primary Examiner*—Matthew V. Nguyen
(74) *Attorney, Agent, or Firm*—Lanny L. Parker

(57) ABSTRACT

A self-adjusting circuit provides a reverse body bias to circuitry in a DROWSY mode. Memory cells having the appropriate skews are supplied with a changing operating voltage potential, causing a memory cell to fail and determining the correct back bias potential $V_{SS}$ to supply that improves operation of the processor in a low power standby mode.

10 Claims, 3 Drawing Sheets

300

DIGITAL REGULATION CIRCUIT

To prolong battery life, low power standby modes have been incorporated into processors to conserve power in portable computers and hand held wireless communication devices. This low power standby or drowsy mode may use analog circuitry to raise the back bias potential $V_{SS}$ that is supplied to source terminals of N-channel transistors. The increased $V_{SS}$ operating voltage above ground produces a reverse body bias that increases the threshold voltage of these N-channel transistors. In order to lower the source-to-drain leakage currents in the drowsy mode, the N-well regions of P-channel transistors may also receive a raised bias that provides a higher threshold voltage.

There is a continuing need for better ways to provide flexibility for operating a microprocessor or other digital circuits while preserving low power operation and the stability of any embedded devices.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

Figure 1:
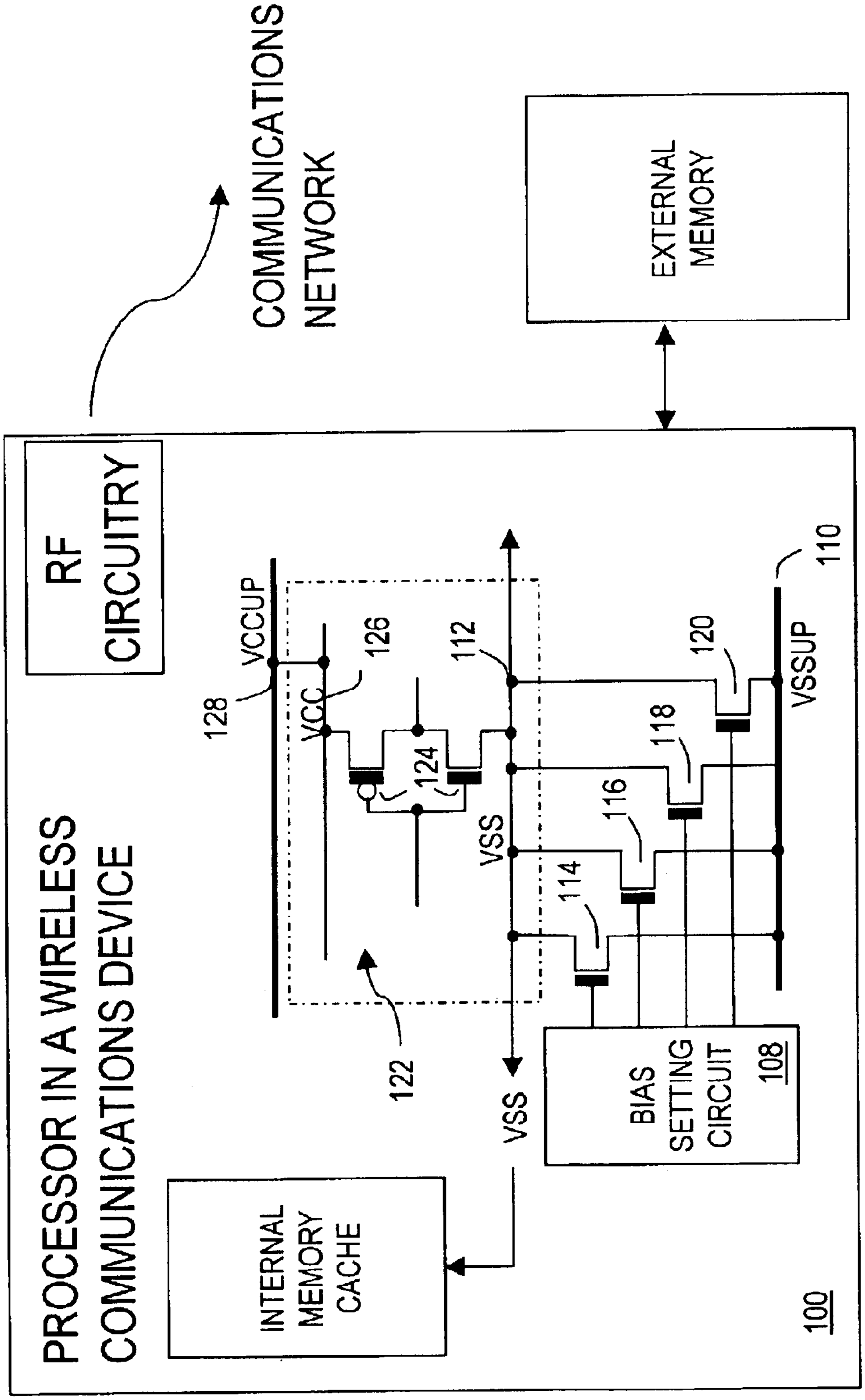
FIG. 1 illustrates multiple transistors connected between a power conductor that supplies the back bias potential $V_{SS}$ to circuitry and a power conductor connected to a pad supply in accordance with the present invention.

It will be appreciated that for simplicity and clarity of illustration, elements illustrated in the figures have not necessarily been drawn to scale. For example, the dimensions of some of the elements may be exaggerated relative to other elements for clarity. Further, where considered appropriate, reference numerals have been repeated among the figures to indicate corresponding or analogous elements.

DETAILED DESCRIPTION

In the following detailed description, numerous specific details are set forth in order to provide a thorough understanding of the invention. However, it will be understood by those skilled in the art that the present invention may be practiced without these specific details. In other instances, well-known methods, procedures, components and circuits have not been described in detail so as not to obscure the present invention.

In the following description and claims, the terms "coupled" and "connected," along with their derivatives, may be used. It should be understood that these terms are not intended as synonyms for each other. Rather, in particular embodiments, "connected" may be used to indicate that two or more elements are in direct physical or electrical contact with each other. "Coupled" may mean that two or more elements are in direct physical or electrical contact. However, "coupled" may also mean that two or more elements are not in direct contact with each other, but yet still co-operate or interact with each other.

Embodiments of the present invention may be used in a variety of applications, with the claimed subject matter incorporated into microcontrollers, general-purpose microprocessors, Digital Signal Processors (DSPs), Reduced Instruction-Set Computing (RISC), Complex Instruction-Set Computing (CISC), among other electronic components. In particular, the present invention may be used in smart phones, communicators and Personal Digital Assistants (PDAs), base band and application processors, automotive infotainment and other products. However, it should be understood that the scope of the present invention is not limited to these examples.

The principles of the present invention may be practiced in wireless devices that are connected in a Code Division Multiple Access (CDMA) cellular network such as IS-95, CDMA 2000, and UMTS-WCDMA and distributed within an area for providing cell coverage for wireless communication. Additionally, the principles of the present invention may be practiced in Wireless Local Area Network (WLAN), 802.11a–b, Orthogonal Frequency Division Multiplexing (OFDM), Ultra Wide Band (UWB), among others. The type of network connection is not intended to limit the scope of the present invention.

Features of the present invention determine to what level VSS may be raised without detrimental effects on the operation of logic or state storage. In general, a reverse body bias is increased to reduce current leakage, where the amount of increase is determined from different sized memory cells that are set to fail to provide a safe operating margin for the standard memory cells in the microprocessor. A digital regulation circuit uses this information to determine an optimal operating level of VSS.

FIG. 1 is an example of a processor 100 in which the features of the present invention may be practiced. A Radio Frequency (RF) block, either on chip or coupled to processor 100, allows wireless communications to other communication devices. Included in processor 100 is a bias setting circuit 108 that selects transistors 114, 116, 118 and 120 to actively set and regulate a back bias potential $V_{SS}$ that is supplied to a block 122. Devices 124 in block 122 represent active circuitry in processor 100, where transistors 114, 116, 118 and 120 are selected to efficiently control the power of the active circuitry in block 122, while ensuring that all state values of any memory elements are retained.

According, the back bias potential on conductor 112 may be set in accordance with a desired design criteria, and adjustments may be made to the bias potential to account for process variations that may shift the threshold voltage of the transistors. The back bias potential may also be dynamically altered dependent on aging induced changes to the transistors and temperature changes that may affect the operation of the part. Note that these changes may happen dynamically, e.g., when the user passes from a low temperature ambient to a higher temperature, such as moving from air conditioned buildings to outdoors.

In operation, the bias affords transistor drain-to-source leakage reduction via two mechanisms. First, a body bias is applied that has the effect of raising the transistor threshold voltage due to the well known body-effects. Second, drain induced barrier lowering is reduced since the drain-to-source voltage $V_{cc}$–$V_{ss}$ is reduced, further lessening drain-to-source leakage currents. However, there is a limit beyond which raising $V_{ss}$ is detrimental. This limit is reached when the reduced signal levels storing the integrated circuit machine state collapse sufficiently to cause a storage cell to flip. This limit should be avoided, and therefore, it is desirable to raise the $V_{ss}$ as much as possible to maximize the leakage power savings while avoiding deleterious loss of state.

Note that transistors 114, 116, 118 and 120 are coupled between a power conductor 112 and a power conductor 110 that receives a voltage potential $V_{SSUP}$ from a supply pad. Transistors 114, 116, 118 and 120 each receive a control signal from bias setting circuit 108 that determines their conductivity, and in turn, determines the back bias potential provided on conductor 112. Although FIG. 1 shows four transistors coupled between power conductor 112 and power conductor 110, the four transistors are not intended as a limitation to the scope of the claimed invention, and other embodiments may incorporate a different number of transistors and even a different type of transistor.

Figure 2:
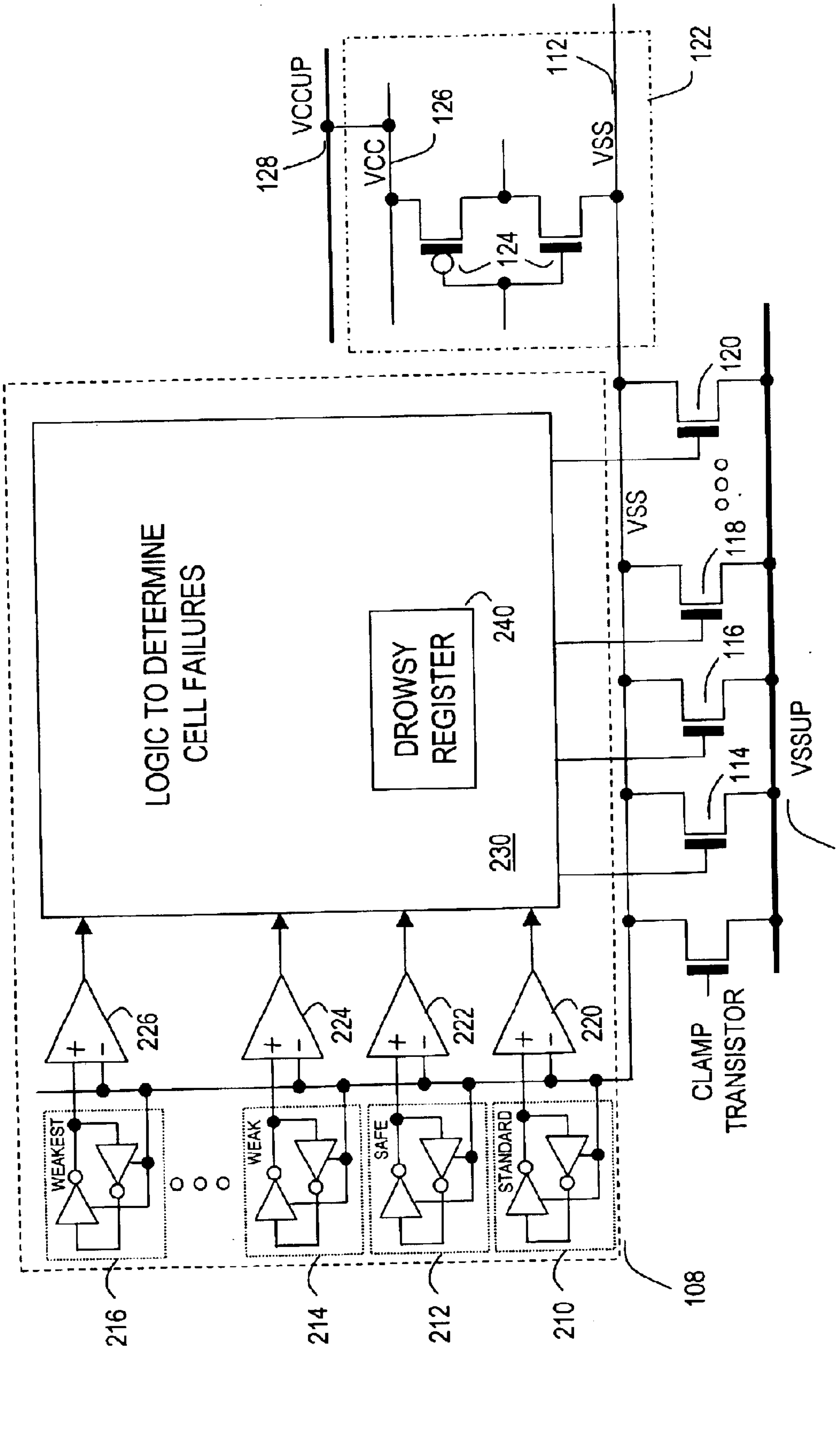
FIG. 2 is a diagram that illustrates one embodiment that may be used in selecting the transistors that set the back bias potential $V_{SS}$.

FIG. 2 is a diagram that illustrates an embodiment that may be used in selecting transistors to set the back bias potential $V_{SS}$ supplied to power conductor 112 in block 122. In this embodiment four Random Access Memory (RAM) cells or latch cells are provided, although any number of cells may be incorporated. Although not show for simplicity, memory cells 210, 212, 214 and 216 include devices that allow the cells to be written and read. The source terminals of the N-channel transistors in cells 210, 212, 214 and 216 are connected to power conductor 112 to receive the back bias potential $V_{SS}$. It should be pointed out that the transistors in each cell may be designed to have different characteristics when compared to the transistors in other cells. In other words, the gate width and length geometries of the cross-coupled inverters may be set by design to correspond to a "standard" cell 210, a "safe" cell 212, a "weak" cell 214 and a "weakest" cell 216. By way of example, the "weakest" cell 216 may have gate dimensions that result in the cell failing at the target body bias, and thus, this cell sets a safe back bias potential VSS that may be provided at power conductor 112. In this manner the cell dimensions may be set to represent the expected worst case due to manufacturing variation as well as designed in circuit imbalance.

The non-inverting inputs of comparators 220, 222, 224 and 226 are connected to respective cells 210, 212, 214 and 216 and the inverting inputs receive the back bias potential $V_{SS}$. A logic block 230 receives the output signals from comparators 220, 222, 224 and 226 and provides signals to control the gates of transistors 114, 116, 118 and 120.

In operation, when processor 100 enters a low power standby (DROWSY) mode, cells 210, 212, 214 and 216 are written. With these cells connected to power conductor 112 to receive the back bias potential $V_{SS}$, some of these memory cells may receive a reverse body bias that causes the memory cell voltages to collapse, disrupting the stored state which essentially represents a system failure. Comparators 220, 222, 224 and 226 monitor the memory cells and provide a status of memory cells that remain stable, along with any memory cell failures to logic block 230. Logic block 230 may include a state machine or combinational logic that receives the status of the memory cells. The state machine maps the status input values and current states to a next state, with changes to the new states depending on the transition function algorithm. Output values, referred to as a digital state value of the state machine, are latched or stored in a register 240 and control the conductivity of transistors 114, 116, 118 and 120. Thus, in response to the status of cells 210, 212, 214 and 216, one or more of transistors 114, 116, 118 and 120 may be conductive to set the back bias potential $V_{SS}$ that is provided at power conductor 112 to the circuitry in block 122. It should be noted that less comparators may be utilized by multiplexing the reference cells 210, 212, 214 and 216 to a single comparator and checking them serially. It is also possible in another embodiment, to use a logic circuit or gate that may simultaneously monitor all inputs, either synchronously or asynchronously. Similarly, the comparator outputs may be multiplexed to a single monitoring node.

By way of example, a part entering the low power standby mode first writes cells 210, 212, 214, 216, then turns off the clamp transistor and changes the contents of register 240 to turn on transistors 114, 116, 118 and 120. With the clamp turned off and these transistors turned on, the back bias potential $V_{SS}$ on power conductor 112 is able to increase. The state machine checks the status of the memory cells through comparators 220, 222, 224 and 226. If memory cells 210, 212, 214 and 216 are stable and not flipped, then the state machine writes register 240 with a value that decreases the conductivity of transistors 114, 116, 118 and 120 and allows the back bias potential $V_{SS}$ to incrementally increase. With the increased back bias potential $V_{SS}$ supplied to cells 210, 212, 214 and 216, the state machine again checks the status of all of the memory cells to determine if a cell may have flipped. The state machine continues in a loop, incrementally increasing the back bias potential $V_{SS}$ and then checking the status of the memory cells. It is expected that the conductivity holding Vss may be decreased until cell 216 switches, which indicates that the point of fail is being approached.

In this example the state machine continues in a loop until a memory cell such as, for example, "weak" memory cell 214 flips, then the state machine writes register 240 with a value that increases the conductivity of transistors 114, 116, 118, 120 and decreases the back bias potential $V_{SS}$ on power conductor 112. This may be initiated by a leakage change caused by, for example, an ambient temperature change. Thus, the self-adjusting reverse body bias circuit efficiently controls the power of the active circuitry in block 122, while ensuring that all state values of any memory elements integrated with processor 100 are retained.

Also by example, should the state machine receive a status input that indicates that either "safe" memory cell 212 or "standard" memory cell 210 has flipped, then the state machine writes register 240 with a value that increases the conductivity of transistors 114, 116, 118, 120 to lower the back bias potential $V_{SS}$ on power conductor 112 by some large, non-incremental amount. It may also signal an error indicating likely loss of state. Note that the flipping of a "standard" memory cell indicates that the processor may be on the verge of failure. The memory cells 210, 212, 214, 216 may be rewritten to initialize the cells, a step that restarts the loop and allows the state machine to reevaluate the stability of the cells and modify the back bias potential $V_{SS}$. While operating processor 100 in the standby mode, the state machine may continuously loop to monitor the status of the memory cells and keep the back bias potential at a safe, optimum level regardless of any ambient changes.

It should be pointed out that transistors 114, 116, 118 and 120 may all have similar conductivity values, or alternatively, the transistors may be "weighted" and each provide different conductivity values. For instance, transistor 116 may conduct two times the current of transistor 114, transistor 118 may conduct four times the current of transistor 114 and transistor 120 may conduct eight times the current of transistor 114. This binary weighting of current conducted by the transistors allows a fine granularity in changes to the back bias potential $V_{SS}$ while using a minimum number of transistors. This also facilitates control via an up/down counter.

Figure 3:
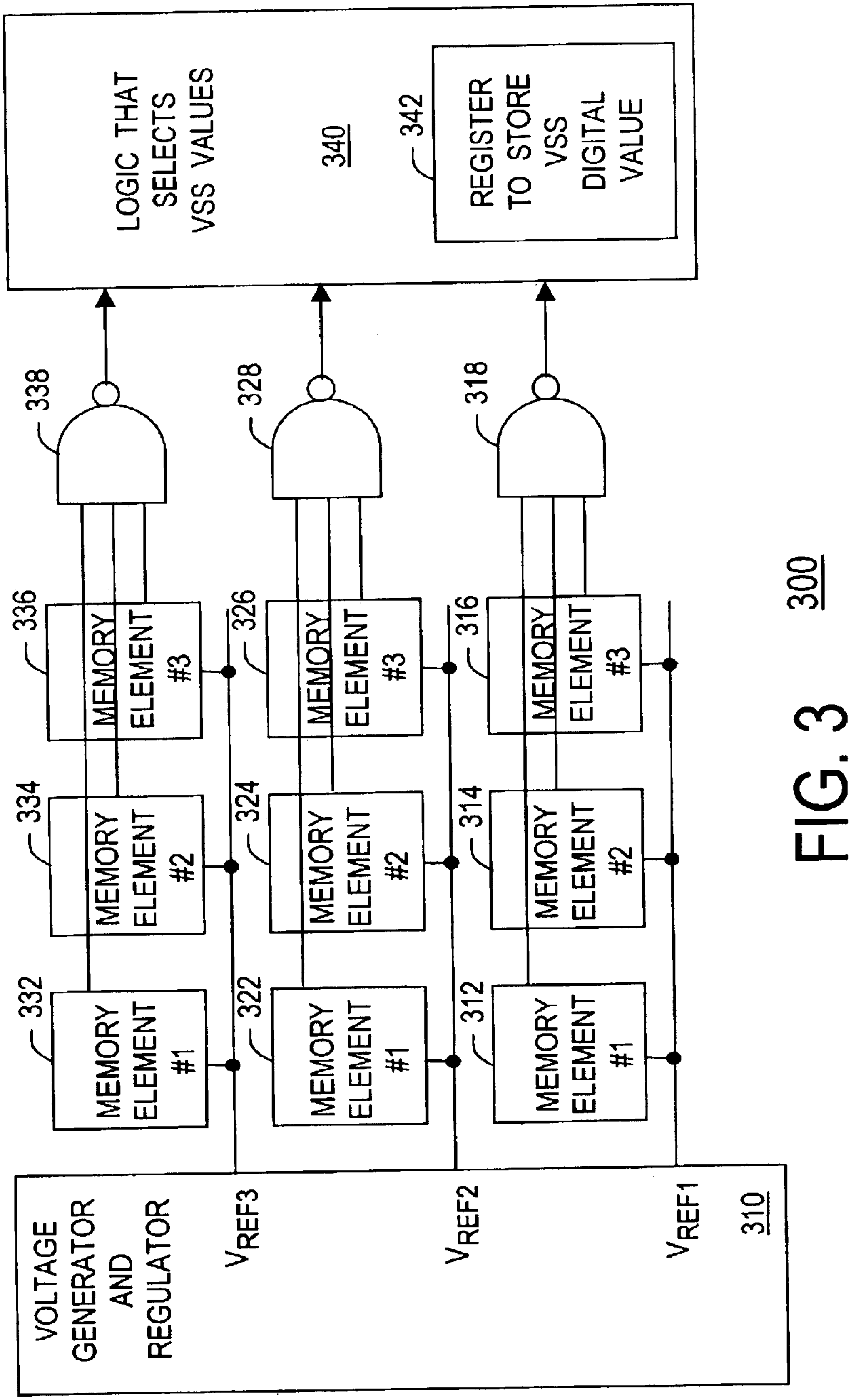
FIG. 3 is a diagram that illustrates another embodiment that may be used in selecting the transistors that set the back bias potential $V_{SS}$.

FIG. 3 is a diagram that illustrates another embodiment that may be used in selecting transistors that are conductive to supply the back bias potential $V_{SS}$ to the circuitry in block 122 (see FIG. 1). A voltage generator block 310 supplies reference voltage potentials of $V_{REF1}$, $V_{REF2}$ and $V_{REF3}$. Memory cells 312, 314 and 316 in a first row receive the reference voltage potential $V_{REF1}$, while a second row having memory cells 322, 324 and 326 receives the reference voltage potential $V_{REF2}$ and a third row of cells has memory cells 332, 334 and 336 that receive the reference voltage potential $V_{REF3}$.

The cells in the first column, i.e., memory cells 312, 322 and 332, are designed having a first set of characteristics; the cells in the second column, i.e., memory cells 314, 324 and 334, are designed having a second set of characteristics; and the cells in the third column, i.e., memory cells 316, 326 and 336, are designed having a third set of characteristics. Put another way, the cells located in the first, second and third columns have gate dimensions skewed by design to different process corners to capture conditions of interest.

Gates 318, 328, 338 may also be replaced by a logic circuit that may incorporate multiplexors or comparators as described previously.

With the reference voltage potential $V_{REF1}$ applied to memory cells 312, 314 and 316, logic circuit 318 provides an output signal to logic block 340 that indicates the status of memory cells in the first row. A reference voltage potential $V_{REF2}$ is applied to memory cells 322, 324 and 326, with logic gate 328 providing an output signal to logic block 340 that indicates the status of memory cells in the second row. A reference voltage potential $V_{REF3}$ is applied to memory cells 332, 334 and 336, with logic circuit 338 providing an output signal to logic block 340 that indicates the status of memory cells in the third row.

In operation, the memory cells are written to a known state and the rows of the array are then back biased as shown in FIG. 3 to reference voltage potentials $V_{REF1}$, $V_{REF2}$ and $V_{REF3}$. Logic gates 318, 328 and 338 provide signals to logic block 340 to indicate the status of the memory cells. The memory cells may be read and the corresponding reference voltage potentials $V_{REF1}$, $V_{REF2}$ and $V_{REF3}$ may be stored in register 342 to record the voltage potentials at which memory failure occurred. This stored information may be used to provide the appropriate back bias potential $V_{SS}$ to the circuitry in block 122 (see FIG. 1).

By now it should be apparent that several embodiments of circuits and several methods of operation have been presented that provide for self-adjusting a reverse body bias supplied to circuitry in a DROWSY mode. Using the appropriate skews on memory cells and some guard-band on the selected self-adjusting reverse body bias allows improved operation of the processor in a low power standby mode.

While certain features of the invention have been illustrated and described herein, many modifications, substitutions, changes, and equivalents will now occur to those skilled in the art. It is, therefore, to be understood that the appended claims are intended to cover all such modifications and changes as fall within the true spirit of the invention.

What is claimed is:

1. A method comprising:

providing a reference voltage to a plurality of memory cells to force at least one memory cell failure and using a digital value based on reading the plurality of memory cells to adjust the reference voltage to a safe operating voltage.

2. The method of claim 1 further comprising:

providing the plurality of memory cells with each memory cell particularly designed to fail at a different reference voltage.

3. The method of claim 1 further comprising:

supplying a first voltage potential at a first power conductor; and using a plurality of transistors coupled between the first power conductor and a second power conductor, where the digital value is supplied to gates of the plurality of transistors to adjust the reference voltage to the safe operating voltage supplied on the second power conductor.

4. The method of claim 1 further comprising:

connecting the second power conductor to a cache memory to supply the safe operating voltage when in a low power mode.

5. The method of claim 1 further comprising:

providing another reference voltage to another plurality of memory cells, where either the reference voltage of the another reference voltage forces a memory cell failure.

6. The method of claim 5 further comprising:

detecting whether the memory cell failure is in the plurality of memory cells or in the another plurality of memory cells and then using a corresponding digital value to adjust the reference voltage to the safe operating voltage.

7. A method comprising:

adjusting a ground reference voltage to a plurality of memory cells having differing gate geometries to determine a failure voltage where one memory cell fails.

8. The method of claim 7 further including:

comparing the ground reference voltage to voltage values at outputs of the plurality of memory cells to determine the failure voltage where the one memory cell fails.

9. The method of claim 7 further including:

using the failure voltage to set a safe operating voltage that is supplied as the ground reference voltage.

10. The method of claim 7 further including:

using the safe operating voltage as the ground reference voltage supplied to at least one memory cell in an array of memory cells.

* * * * *